United States Patent
Naito

(10) Patent No.: US 9,035,351 B2
(45) Date of Patent: May 19, 2015

(54) SEMICONDUCTOR DEVICE

(71) Applicant: FUJI ELECTRIC CO., LTD., Kawasaki (JP)

(72) Inventor: Tatsuya Naito, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 45 days.

(21) Appl. No.: 13/766,424

(22) Filed: Feb. 13, 2013

(65) Prior Publication Data

US 2013/0153955 A1  Jun. 20, 2013

Related U.S. Application Data

(63) Continuation of application No. PCT/JP2011/071154, filed on Sep. 15, 2011.

(30) Foreign Application Priority Data

Sep. 17, 2010 (JP) .................................. 2010-210105

(51) Int. Cl.
*H01L 29/06* (2006.01)
*H01L 29/08* (2006.01)
(Continued)

(52) U.S. Cl.
CPC ........ *H01L 29/0615* (2013.01); *H01L 29/0834* (2013.01); *H01L 29/7395* (2013.01); *H01L 29/0619* (2013.01); *H01L 29/402* (2013.01)

(58) Field of Classification Search
CPC ....... H01L 29/06; H01L 29/66; H01L 29/739; H01L 27/06; H01L 27/082
USPC ......... 257/139, 125, 164, 198, 514, 133, 565, 257/183, 189, 194, 195, 200, 442, 614
See application file for complete search history.

(56) References Cited

U.S. PATENT DOCUMENTS 5,360,984 A * 11/1994 Kirihata ...................... 257/139
7,470,952 B2 * 12/2008 Ruething et al. ............. 257/327
(Continued)

FOREIGN PATENT DOCUMENTS

| JP | 1-282872 | 11/1989 |
| JP | 4-320377 | 11/1992 |

(Continued)

OTHER PUBLICATIONS

International Search Report of Corresponding PCT Application PCT/JP2011/071154 mailed Nov. 22, 2011.

(Continued)

*Primary Examiner* — Chuong A Luu

(57) ABSTRACT

A semiconductor device having a p base region and an $n^+$ emitter region that come into contact with an emitter electrode and are selectively provided in a surface layer of an $n^-$ drift layer. A gate electrode is provided on a portion of the front surface of the $n^-$ drift layer which is interposed between the $n^+$ emitter regions, with a gate insulating film interposed therebetween. In some exemplary embodiments, an $n^+$ buffer layer and a p collector layer which have a higher impurity concentration than the $n^-$ drift layer are sequentially provided on a surface of the $n^-$ drift layer opposite to the front surface on which the $n^+$ emitter region is provided. The impurity concentration of the $n^+$ buffer layer is equal to or greater than $7 \times 10^{16}$ $cm^{-3}$ and equal to or less than $7 \times 10^{17}$ $cm^{-3}$. Accordingly, it is possible to obtain high field decay resistance.

3 Claims, 9 Drawing Sheets

(51) Int. Cl.
*H01L 29/739* (2006.01)
*H01L 29/40* (2006.01)

(56) References Cited

U.S. PATENT DOCUMENTS

| | | | | |
|---|---|---|---|---|
| 2008/0315248 | A1* | 12/2008 | Tokura et al. | 257/139 |
| 2009/0289278 | A1* | 11/2009 | Torii | 257/139 |
| 2014/0070265 | A1* | 3/2014 | Korec et al. | 257/139 |

FOREIGN PATENT DOCUMENTS

| | | |
|---|---|---|
| JP | 5-114606 | 5/1993 |
| JP | 5-152574 | 6/1993 |
| JP | 6-318706 | 11/1994 |
| JP | 7-211895 | 8/1995 |
| JP | 8-288503 | 1/1996 |
| JP | 11-97715 | 4/1999 |
| JP | 2006-332182 | 12/2006 |
| JP | 2009-117786 | 5/2009 |
| JP | 2009-130096 | 6/2009 |
| JP | 2009-283818 | 12/2009 |
| JP | 4441943 | 1/2010 |

OTHER PUBLICATIONS

Japanese Office Action dated Oct. 21, 2014 in corresponding Japanese Patent Application No. 2012-534055.

* cited by examiner

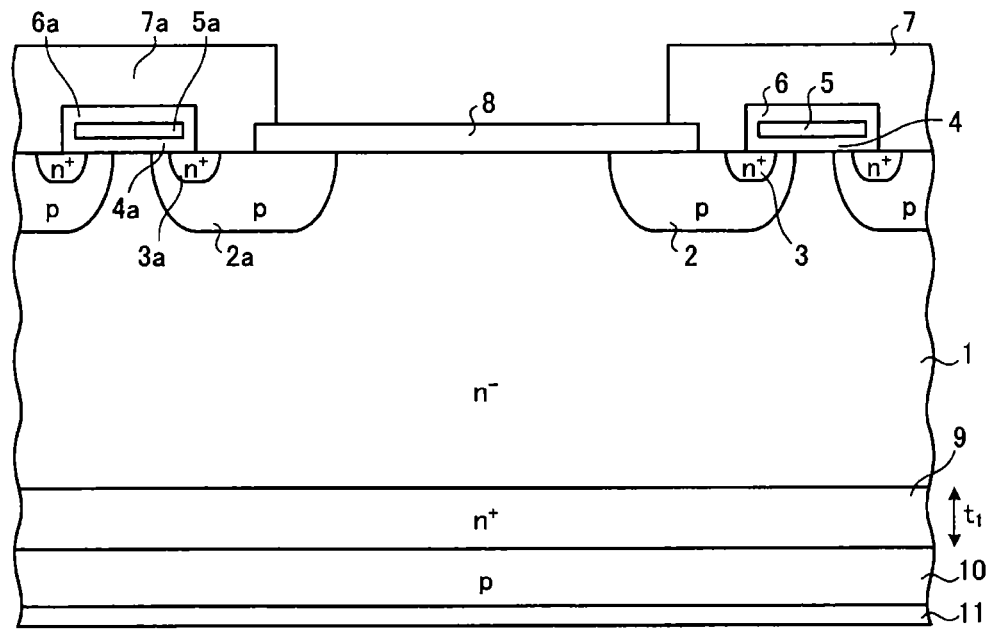
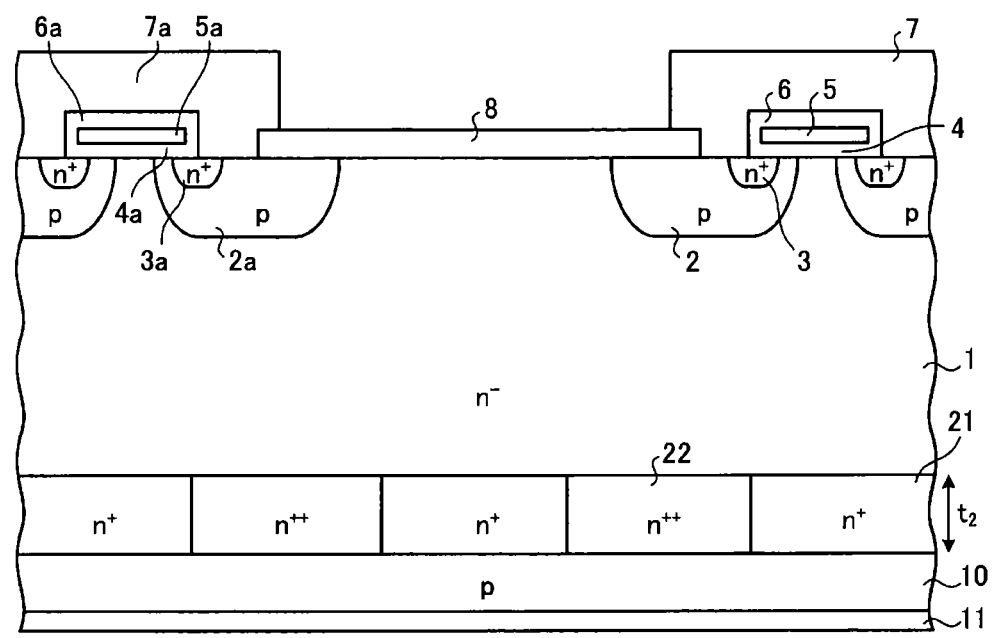

SEMICONDUCTOR DEVICE

CROSS-REFERENCE TO RELATED APPLICATIONS

This is a continuation application, filed under 35 U.S.C. §111(a), of International Patent Application No. PCT/JP2011/071154 filed Sep. 15, 2011, which claims the foreign benefit of Japanese Patent Application No. 2010-210105, filed Sep. 17, 2010, the disclosures of all of which are incorporated herein by reference.

BACKGROUND

1. Field

The present invention relates to semiconductor devices.

2. Description of the Related Art

Measures for electrically controlling the vehicle to increase the breakdown voltage of semiconductor chips or semiconductor packages used in various kinds of electronic control are needed more than ever today. For example, high anti-surge characteristics are required for an internal-combustion ignition device (hereinafter, referred to as an igniter) and resistance to a negative surge (hereinafter, referred to as a field decay surge), which is one of various kinds of surges, output from an inductive load needs to be improved.

For example, an IGBT (insulated gate bipolar transistor) has been known as the semiconductor device used in the igniter. FIG. 14 is a cross-sectional view illustrating the IGBT according to the related art. In the IGBT illustrated in FIG. 14, a p base region 102 and an n$^+$ emitter region 103 are selectively provided in a surface layer of the front surface of an n$^-$ drift layer 101. A gate electrode 105 is provided on the front surface of the n$^-$ drift layer 101, with a gate insulating film 104 interposed therebetween. An emitter electrode 107 comes into contact with the p base region 102 and the n$^+$ emitter region 103. In addition, the emitter electrode 107 is insulated from the gate electrode 105 by an interlayer insulating film 106.

An oxide film 108 covers the n$^-$ drift layer 101 exposed from the surface of the chip. An n$^+$ buffer layer 109 and a p collector layer 110 are sequentially provided on a surface (rear surface) of the n$^-$ drift layer 101 which is opposite to the front surface in which the n$^+$ emitter region 103 is provided. The impurity concentration of the n$^+$ buffer layer 109 is about $5.4 \times 10^{16}$ cm$^{-3}$. The thickness $t_{10}$ of the n$^+$ buffer layer 109 is generally about 30 μm. A collector electrode 111 is provided on the surface of the p collector layer 110.

FIG. 15 is a cross-sectional view illustrating another example of the IGBT according to the related art. In the IGBT illustrated in FIG. 15, a breakdown voltage structure for ensuring a breakdown voltage is provided at the outer circumferential end of the chip. The breakdown voltage structure surrounds an active region in which a drift current flows. The active portion has the same structure as that in the IGBT illustrated in FIG. 14. In the breakdown voltage structure, a field limiting ring 112, which is a floating p$^+$ region, is provided in a surface layer of an n$^-$ drift layer 101. In addition, an n$^+$ stopper region 113 is provided in the surface layer of the n$^-$ drift layer 101 at the outer circumferential end of the chip.

A field plate electrode 114 comes into contact with the field limiting ring 112. A stopper electrode 115 comes into contact with an n$^+$ stopper region 113. In addition, the stopper electrode 115 extends from the top of the n$^+$ stopper region 113 to the surface of an oxide film 108. A p collector layer 110 is provided on the rear surface of the n$^-$ drift layer 101. The other structures are the same as those of the IGBT illustrated in FIG. 14.

As a semiconductor device having a current limit function for an overcurrent, a device has been proposed in which the distance between a sense IGBT and a main IGBT in the horizontal direction is equal to or more than 1500 μm and the amount of Hall current flowing (running) to the sense IGBT is reduced to prevent the oscillation of a current waveform during soft turn-off (for example, see the following Patent Document 1).

In addition, as a semiconductor device with improved surge resistance, a device has been proposed which includes: an insulated gate transistor that is formed in a chip and is arranged in a current path, with a high-voltage-side terminal or a low-voltage-side terminal connected to a load; a gate voltage boost element that is provided in the chip, with one end connected to a gate terminal of the insulated gate transistor, and is operated by a surge voltage applied from the high voltage side of the insulated gate transistor; a back-flow prevention element that is provided in the chip so as to be arranged in series between the gate terminal of the insulated gate transistor and the gate voltage boost element and prevents a back flow when a surge is applied; a clamping element that is provided between the low-voltage-side terminal and the gate terminal of the insulated gate transistor in the chip and clamps a voltage applied to the gate terminal of the insulated gate transistor to an operating voltage; a surge prevention element that is provided between the clamping element and the low-voltage-side terminal of the insulated gate transistor in the chip and prevents a surge from a ground line; a high-voltage-side connection pad that is formed in a peripheral portion of the chip and is connected to the high-voltage-side terminal of the insulated gate transistor; a boost element connection pad that is formed in the peripheral portion of the chip and is connected to one end of the gate voltage boost element; and a wiring material that is provided between a connection point provided outside the chip and the high-voltage-side connection pad connected to the high-voltage-side terminal of the insulated gate transistor, electrically connects the high-voltage-side connection pad to a boost element connection pad which is connected to the gate voltage boost element, is connected in parallel to the boost element connection pad, as viewed from the connection point, and serves as parasitic inductance when a surge is applied. In the device, the high-voltage-side connection pad connected to the high-voltage-side terminal of the insulated gate transistor and the boost element connection pad connected to the gate voltage boost element are not connected by wiring lines in the chip (for example, see the following Patent Document 2).

CITATION LIST

Patent Document 1: JP 2009-117786 A
Patent Document 2: JP 4441943 B1

SUMMARY

However, the inventors conducted studies and found the following. FIG. 9 is a diagram illustrating the circuit structure of an igniter. As illustrated in FIG. 9, an igniter 120 includes an IGBT 121 and a control IC 122. The IGBT 121 includes, for example, a main IGBT and a sense IGBT that share a gate and a collector and has a sensing function. The collector of the main IGBT is connected to a primary coil of an ignition coil 131 through a collector terminal C of the igniter 120. The emitter of the main IGBT is connected to a ground terminal G of the igniter 120.

A battery input terminal B of the control IC 122 is connected to a positive electrode of a battery 132 through a battery input terminal B of the igniter 120. A sense resistor 123 provided in the control IC 122 is connected to between the emitter of the main IGBT and the emitter of the sense IGBT. The gate of the main IGBT is connected to an ECU (Electronic Control Unit) 133 connected to an ignition signal input terminal S of the igniter 120 through the control IC 122. The IGBT 121 is turned on and off on the basis of an ignition signal input from the ECU 133.

The field decay test was performed on the igniter in which the main IGBT was the IGBT (see FIGS. 14 and 15) according to the related art and the operation of the igniter when a field decay surge was applied was examined. The field decay test repeatedly applies a negative surge between the collector and the ground of the device to verify the field decay resistance of the device.

FIG. 10 is a diagram illustrating a field decay test circuit. In FIG. 10, in order to clarify the connection state between a pulse generator 140 and an igniter 120, the other structures are not shown. FIG. 11 is a characteristic diagram illustrating the field decay surge waveform of the field decay test. FIG. 12 is a characteristic diagram illustrating the waveform of the operating voltage of the IGBT according to the related art when a field decay surge is applied. As illustrated in FIG. 10, the battery input terminal B and the ground terminal G of the igniter 120 are connected to the high-voltage-side terminal A and the low-voltage-side terminal D of the pulse generator 140 of the field decay test circuit, respectively. The connection resistance between the high-voltage-side terminal A and the low-voltage-side terminal D of the pulse generator 140 was 25Ω. A mass-production-type coil was used as the ignition coil 131.

Then, an ignition signal with an external power supply voltage Vcc of 5 V was input to the ignition signal input terminal S of the igniter 120 to operate the IGBT. The switching frequency f of the ignition signal was 16.7 Hz (corresponding to 2000 rpm in terms of an engine rpm). During an operation, a field decay surge voltage (see FIG. 11) of −100 V was applied to the IGBT 300 times at an interval of 2 seconds and it was verified whether the IGBT endured the field decay test. The power supply voltage VB of the pulse generator 140 was 14 V. The ambient temperature T of the igniter was 25° C. The rated current Icp at a time of 1 ms was 8 A when protection at the time of an accident, such as a load short, was considered. At a result, an abnormal voltage due to the field decay surge was added to the operation waveform of the IGBT (see FIG. 12) and desired field decay resistance meeting the standards of the field decay test was not obtained in the igniter using the IGBT according to the related art.

In the field decay test, the field decay resistance is determined by the following four factors causing the breakdown of the IGBT. FIG. 13 is a diagram illustrating the main factors of the breakdown of the device due to the field decay surge. When a drain current beyond the safe operating range flows to the IGBT due to the field decay surge and the internal temperature is rapidly increased (hereinafter, referred to as thermal runaway breakdown), there is a concern that breakdown will occur in the IGBT. The main causes of the thermal runaway breakdown are classified into the large loss of the IGBT and the low radiation performance of the package.

The loss of the IGBT is the ratio (loss density) of the overall loss which is determined by a breakdown voltage (reverse breakdown voltage) due to a pn junction of the n$^+$ buffer layer 109 and the p collector layer 110 formed on the rear surface of the IGBT, partial loss which occurs due to the surface layout of elements, and the loss of the IGBT with respect to a chip size. A factor determining the radiation performance is the thermal resistance between the package and the chip or the thermal resistance between the package and a heat sink.

It is possible to improve the radiation performance between the package and other components by increasing the surface area of, for example, the heat sink. However, it is difficult to reduce the loss of the IGBT. For example, the pn junction which determines the reverse breakdown voltage of the IGBT is exposed from the side surface of the chip after dicing. Therefore, a variation in the reverse leakage current or the reverse breakdown voltage of the IGBT increases depending on the accuracy of a dicing process or a mounting process. As a result, it is difficult to reduce the overall loss of the IGBT. These problems make it difficult to improve the field decay resistance of the IGBT.

The invention has been made in view of the above-mentioned problems of the related art and an object of the invention is to provide a semiconductor device with high field decay resistance.

Means for Solving the Problems

In order to solve the above-mentioned problems and achieve the object of the invention, according to a first aspect of the invention, a semiconductor device includes: a first semiconductor layer that is a first conduction type; a second semiconductor layer that is a second conduction type and is provided on a surface of the first semiconductor layer; a third semiconductor layer that is the second conduction type, is provided on a surface of the second semiconductor layer, and has a lower impurity concentration than the second semiconductor layer; a first semiconductor region that is the first conduction type and is selectively provided in a surface layer of the third semiconductor layer; a second semiconductor region that is the second conduction type and is selectively provided in a surface layer of the first semiconductor region; a first electrode that is provided on a surface of the first semiconductor region interposed between the third semiconductor layer and the second semiconductor region, with an insulating film interposed therebetween; a second electrode that comes into contact with the first semiconductor region and the second semiconductor region; and a third electrode that is provided on a surface of the first semiconductor layer which is opposite to the surface on which the third semiconductor layer is provided. The impurity concentration of the second semiconductor layer is equal to or greater than $7 \times 10^{16}$ cm$^{-3}$ and equal to or less than $7 \times 10^{17}$ cm$^{-3}$.

According to a second aspect of the invention, in the semiconductor device according to the first aspect (for example), the thickness of the second semiconductor layer may be equal to or greater than 18 μm and equal to or less than 24 μm.

According to a third aspect of the invention, in the semiconductor device according to the first aspect (for example), the second semiconductor layer and a first low-resistance layer that is the second conduction type, comes into contact with the first semiconductor layer and the third semiconductor layer through the second semiconductor layer, and has a higher impurity concentration than the second semiconductor layer may be alternately arranged.

According to a fourth aspect of the invention, in the semiconductor device according to the third aspect (for example), the first low-resistance layer may be provided in a portion other than an outer circumferential end of a substrate.

According to a fifth aspect of the invention, a semiconductor device includes: a first semiconductor layer that is a first conduction type; a third semiconductor layer that is a second conduction type and is provided on a surface of the first semiconductor layer; a first semiconductor region that is the first conduction type and is selectively provided in a surface layer of the third semiconductor layer; a second semiconductor region that is the second conduction type and is selectively provided in a surface layer of the first semiconductor region; a first electrode that is provided on a surface of the first semiconductor region interposed between the third semiconductor layer and the second semiconductor region, with an insulating film interposed therebetween; a second electrode that comes into contact with the first semiconductor region and the second semiconductor region; a third electrode that is provided on a surface of the first semiconductor layer opposite to the third semiconductor layer; and a second low-resistance layer that is the second conduction type, comes into contact with the third semiconductor layer and the third electrode through the first semiconductor layer, and has a higher impurity concentration than the third semiconductor layer.

According to a sixth aspect of the invention, in the semiconductor device according to the fifth aspect (for example), the second low-resistance layer may be provided at an outer circumferential end of a substrate.

Effects of Embodiments of the Invention

According to a semiconductor device of embodiments of the invention, it is possible to provide a semiconductor device with high field decay resistance.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIG. 1 is a cross-sectional view illustrating a main portion of a semiconductor device according to a first embodiment.

FIG. 2 is a cross-sectional view illustrating a main portion of a semiconductor device according to a second embodiment.

DESCRIPTION OF EMBODIMENTS

Figure 3:
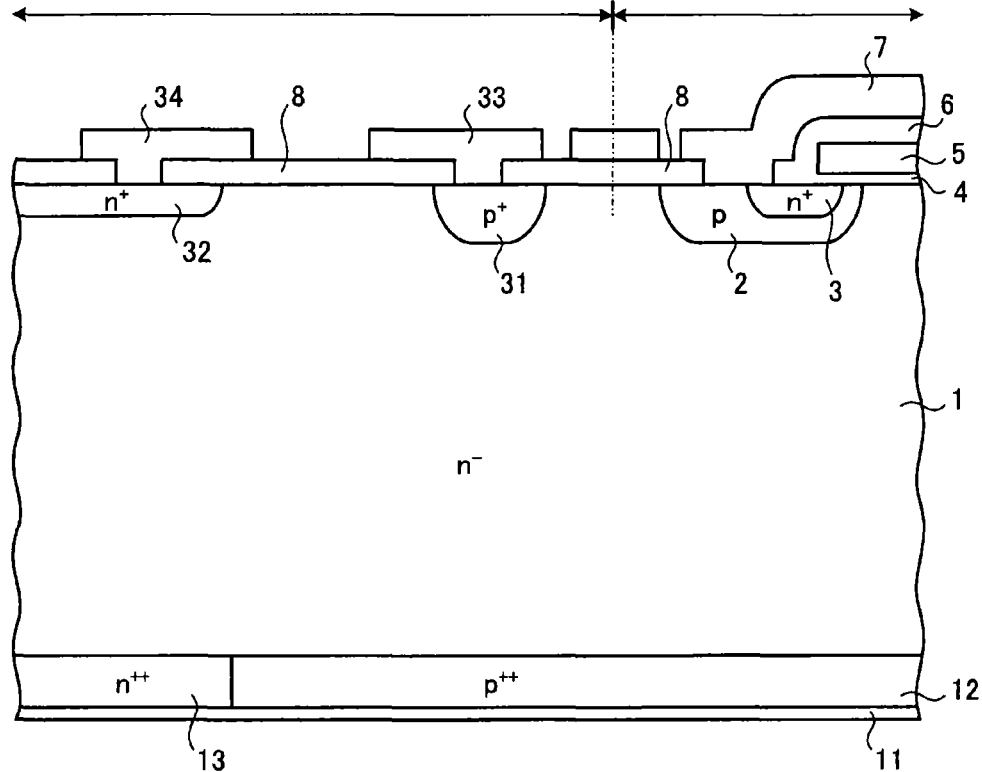
FIG. 3 is a cross-sectional view illustrating a main portion of a semiconductor device according to a third embodiment.

Hereinafter, semiconductor devices according to exemplary embodiments of the invention will be described in detail with reference to the accompanying drawings. In the specification and the accompanying drawings, in the layers or regions having "n" or "p" appended thereto, an electron or a hole is a major carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated.

First Embodiment

FIG. 1 is a cross-sectional view illustrating a main portion of a semiconductor device according to a first embodiment. The semiconductor device illustrated in FIG. 1 is a vertical IGBT (insulated gate bipolar transistor). In the IGBT illustrated in FIG. 1, a main IGBT is formed on the right side of the plane of paper and a p base region (first semiconductor region) 2 is selectively provided in a surface layer of an n$^-$ drift layer (third semiconductor layer) 1. An n$^+$ emitter region (second semiconductor region) 3 is selectively provided in a surface layer of the p base region 2.

A gate electrode (first electrode) 5 is provided on a front surface of the n$^-$ drift layer 1 interposed between the n$^-$ drift layer 1 and the n$^+$ emitter region 3, with a gate insulating film (insulating film) 4 interposed therebetween. An emitter electrode (second electrode) 7 comes into contact with the p base region 2 and the n$^+$ emitter region 3. In addition, the emitter electrode 7 is insulated from the gate electrode 5 by an interlayer insulating film 6. An oxide film 8 covers a portion of the n$^-$ drift layer 1 exposed from the surface of the chip. A sense IGBT is formed on the left side of the plane of paper through the oxide film 8 and includes a p base region 2a that is separated from the p base region 2 and an n$^+$ emitter region 3a that is separated from the n$^+$ emitter region 3. A gate electrode 5a is connected to the gate electrode 5 through a gate insulating film (insulating film) 4a. An emitter electrode 7a is separated from the emitter electrode 7 through an interlayer insulating film 6a. In this way, the main IGBT and the sense IGBT are simultaneously turned on or off by a common signal input to the gate electrodes 5 and 5a and an emitter current which substantially corresponds to the area ratio of the p base region 2 and the p base region 2a flows as a minute current to the emitter electrode 7a and flows a main current to the emitter electrode 7.

An n$^+$ buffer layer (second semiconductor layer) 9 and a p collector layer (first semiconductor layer) 10 are sequentially provided on a surface (rear surface) of the n$^-$ drift layer 1 opposite to the front surface in which the n$^+$ emitter region 3 is provided. The n$^+$ buffer layer 9 has a higher impurity concentration than the n⁻ drift layer 1. It is preferable that the impurity concentration of the n⁺ buffer layer 9 be equal to or greater than $7 \times 10^{16}$ cm⁻³ and equal to or less than $7 \times 10^{17}$ cm⁻³. This is because the reverse breakdown voltage of the IGBT can be reduced in the above-mentioned range.

Figure 14:
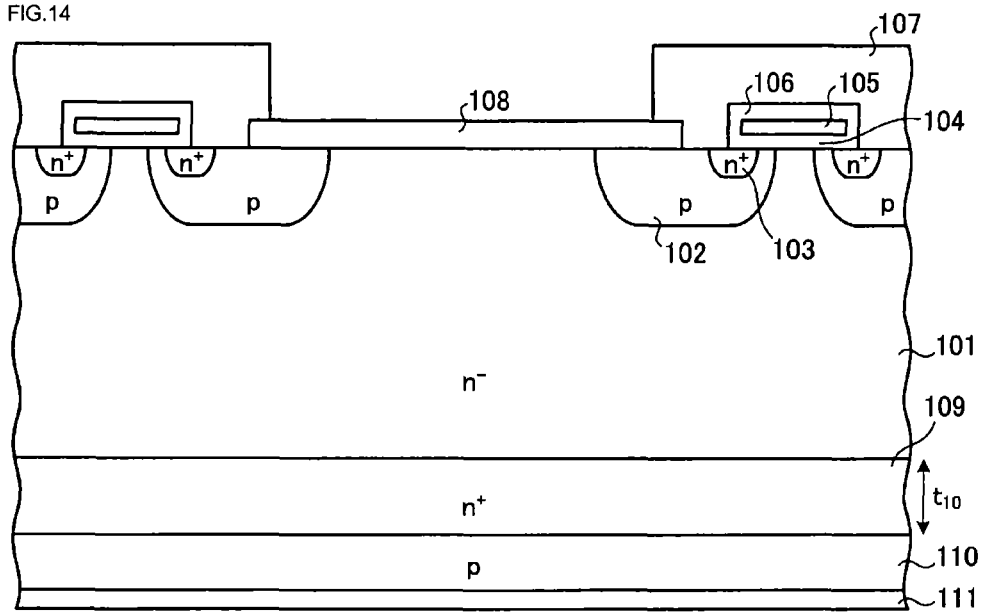
FIG. 14 is a cross-sectional view illustrating the IGBT according to the related art.
Figure 15:
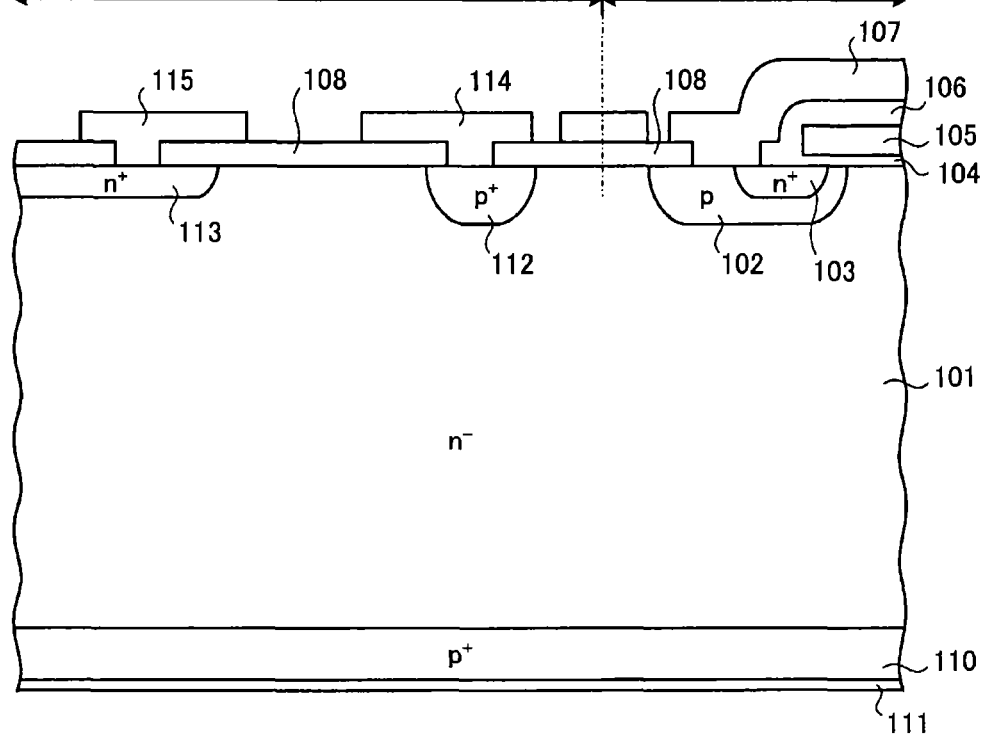
FIG. 15 is a cross-sectional view illustrating another example of the IGBT according to the related art.

It is preferable that the thickness $t_1$ of the n⁺ buffer layer 9 be equal to or greater than 18 μm and equal to or less than 24 μm. When the thickness $t_1$ of the n⁺ buffer layer 9 is less than the thickness $t_{10}$ of the IGBT (see FIG. 14) according to the related art, it is possible to prevent an increase in the on voltage Von of the IGBT even when the impurity concentration of the n⁺ buffer layer 9 is higher than that of the IGBT according to the related art.

The impurity concentration and thickness of the n⁺ buffer layer 9 may be determined according to a desired threshold voltage VCE (sat) between the collector and the emitter, a desired switching speed, desired ESB resistance, and desired field decay resistance. The term "ESB" means energy that returns between the collector (C) and the emitter (E) of the IGBT of the igniter when no discharge occurs in an ignition plug due to an ignition error and the return energy is determined by the breaking current and the coil of the igniter. In addition, the n⁺ buffer layer 9 may be formed on the surface of the p collector layer 10 by epitaxial growth. A collector electrode (third electrode) 11 is provided on the rear surface of the p collector layer 10.

As described above, according to the first embodiment, since the impurity concentration of the n⁺ buffer layer 9 is higher than that in the related art, it is possible to increase electric field intensity in the vicinity of the interface between the n⁺ buffer layer 9 and the p collector layer 10. In this way, it is possible to reduce the breakdown voltage (reverse breakdown voltage) determined by a pn junction of the n⁺ buffer layer 9 and the p collector layer 10 and thus reduce loss (overall loss) due to the operation of the IGBT when a field decay surge is applied, as compared to the related art. Therefore, it is possible to improve the field decay resistance of the IGBT.

Second Embodiment

FIG. 2 is a cross-sectional view illustrating a main portion of a semiconductor device according to a second embodiment. An n⁺⁺ semiconductor layer (hereinafter, referred to as an n⁺⁺ buffer layer) having a higher concentration than an n⁺ buffer layer and the n⁺ buffer layer may be alternately provided.

In the second embodiment, as illustrated in FIG. 2, an n⁺⁺ buffer layer (first low resistance layer) 22 is provided in an n⁺ buffer layer 21 so as to come into contact with an n⁻ drift layer 1 and a p collector layer 10 through the n⁺ buffer layer 21. The n⁺ buffer layer 21 and the n⁺⁺ buffer layer are alternately provided. That is, a buffer layer including the n⁺ buffer layer 21 and the n⁺⁺ buffer layer 22 is provided in the IGBT illustrated in FIG. 2.

The n⁺⁺ buffer layer 22 has a higher impurity concentration than that of the n⁺ buffer layer 21. It is preferable that the impurity concentration of the n⁺ buffer layer 21 be $5.4 \times 10^{16}$ cm⁻³. It is preferable that the thickness $t_2$ of the n⁺ buffer layer 21 be 30 μm. The thickness $t_2$ of the n⁺⁺ buffer layer 22 is equal to the thickness $t_2$ of the n⁺ buffer layer 21. The reason is as follows. Since ESB resistance is determined by the thickness of the n⁺ buffer layer 21, the above-mentioned thickness of the n⁺ buffer layer 21 makes it possible to improve the ESB resistance.

It is preferable that the impurity concentration of the n⁺⁺ buffer layer 22 be $7 \times 10^{16}$ cm⁻³. In addition, the impurity concentration of the n⁺⁺ buffer layer 22 may be equal to that of the buffer layer (see FIG. 1) according to the first embodiment. The reason is as follows. Since the field decay resistance is determined by the impurity concentration of the n⁺⁺ buffer layer 22, the above-mentioned impurity concentration of the n⁺⁺ buffer layer 22 makes it possible to improve the field decay resistance, similarly to the first embodiment.

When the n⁺⁺ buffer layer 22 has the above-mentioned impurity concentration, the overall impurity concentration of the buffer layer increases. However, since the n⁺ buffer layer 21 is selectively provided, it is possible to reduce an increase in the on voltage Von of the IGBT even though the thickness of the buffer layer is the same as that in the related art.

The n⁺⁺ buffer layer 22 is provided in a portion other than the outer circumferential end of the chip (substrate). That is, the n⁺⁺ buffer layer 22 is not provided at the outer circumferential end of the chip, but the n⁺ buffer layer 21 is provided at the outer circumferential end of the chip. The other structures are the same as those of the first embodiment.

As described above, according to the second embodiment, it is possible to obtain the same effect as that of the first embodiment. In addition, since the n⁺ buffer layer 21 and the n⁺⁺ buffer layer 22 have the above-mentioned thicknesses, it is possible to improve ESB resistance.

Since the n⁺⁺ buffer layer 22 is not provided at the outer circumferential end of the chip, but the n⁺ buffer layer 21 is provided at the outer circumferential end of the chip, it is possible to provide a region with the maximum electric field intensity inside the outer circumference of the chip. Therefore, breakdown can occur inside the outer circumference of the chip. In this way, even when the pn junction which determines the reverse breakdown voltage of the IGBT is exposed from the side surface of the chip after dicing, it is possible to prevent an increase in the variation of the reverse leakage current or the reverse breakdown voltage of the IGBT.

Third Embodiment

FIG. 3 is a cross-sectional view illustrating a main portion of a semiconductor device according to a third embodiment. An n⁺ buffer layer may not be provided and an n⁺⁺ semiconductor layer (hereinafter, referred to as an n⁺⁺ collector layer) may be provided in a p⁺⁺ collector layer.

In the third embodiment, as illustrated in FIG. 3, an n⁻ drift layer 1 comes into contact with a p⁺⁺ collector layer 12. That is, no n⁺ buffer layer is provided. In addition, an n⁺⁺ collector layer (second low-resistance layer) 13 is provided in the p⁺⁺ collector layer 12 so as to come into contact with the n– drift layer 1 and a collector electrode 11 through the p⁺⁺ collector layer 12. The n⁺⁺ collector layer 13 has a higher impurity concentration than that of the n⁻ drift layer 1.

The p⁺⁺ collector layer 12 and the n⁺⁺ collector layer 13 have the same thickness. That is, a collector layer including the p⁺⁺ collector layer 12 and the n⁺⁺ collector layer 13 is provided in the IGBT illustrated in FIG. 3. The n⁺⁺ collector layer 13 is provided at the outer circumferential end of the chip. A breakdown voltage structure that surrounds an active portion and ensures a breakdown voltage is provided at the outer circumferential end of the chip. That is, the n⁺⁺ collector layer 13 is provided in the breakdown voltage structure. The active portion has the same structure as that in the IGBT according to the first embodiment.

The breakdown voltage structure surrounds the active portion in which a drift current flows. In the breakdown voltage structure, a field limiting ring 31, which is a floating p⁺ region, is provided in a surface layer of the n⁻ drift layer 1. An n⁺ stopper region 32 is provided in a surface layer of the n⁻ drift layer 1 at the outer circumferential end of the chip.

A field plate electrode 33 comes into contact with the field limiting ring 31. A stopper electrode 34 comes into contact with the n⁺ stopper region 32. The stopper electrode 34 extends from the top of the n⁺ stopper region 32 to the surface of an oxide film 8. The other structures are the same as those of the first embodiment.

For example, the $p^{++}$ collector layer 12 and the $n^{++}$ collector layer 13 are formed as follows. First, an FZ wafer, which is the n⁻ drift layer 1, is prepared. Then, an element structure is formed on a surface of the n⁻ drift layer 1 on the side of the n⁺ emitter region 3. Then, the FZ wafer is ground from a surface of the n⁻ drift layer 1 opposite to the surface in which the n⁺ emitter region 3 is formed and is thinned. Then, a resist in which a region for forming the $p^{++}$ collector layer 12 is opened is formed on the ground surface of the FZ wafer by photolithography.

Then, ion implantation and a heat treatment are performed using the resist as a mask to form the $p^{++}$ collector layer 12 on a portion of the n⁻ drift layer 1 which is exposed through the opening of the resist. Then, a resist in which a region for forming the $n^{++}$ collector layer 13 is opened is formed on the ground surface of the FZ wafer. Then, ion implantation and a heat treatment are performed using the resist as a mask to form the $n^{++}$ collector layer 13 on a portion of the n⁻ drift layer 1 which is exposed through the opening of the resist. In the above-mentioned process, the order in which the $p^{++}$ collector layer 12 and the $n^{++}$ collector layer 13 are formed may be reversed.

Figure 4:
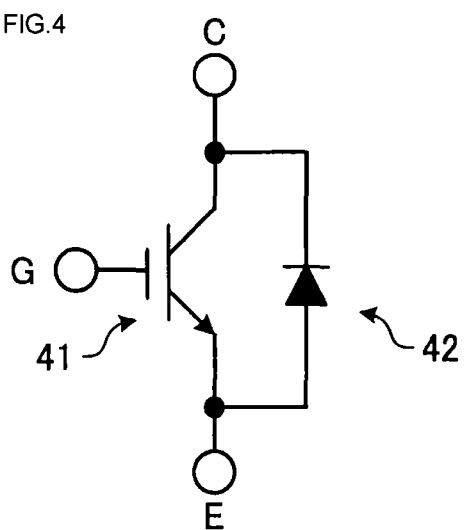
FIG. 4 is a circuit diagram illustrating the equivalent circuit of the semiconductor device illustrated in FIG. 3.

FIG. 4 is a circuit diagram illustrating the equivalent circuit of the semiconductor device illustrated in FIG. 3. Since the $n^{++}$ collector layer 13 is provided, the IGBT and a reverse conducting diode including the p base region 2, the n⁻ drift layer 1, and the $n^{++}$ collector layer 13 are formed on the same chip. In this way, as illustrated in FIG. 4, in the semiconductor device illustrated in FIG. 3, a collector of an IGBT 41 is connected to a cathode of a diode 42 and an emitter of the IGBT 41 is connected to an anode of the diode 42, that is, the diode 42 is connected in inverse-parallel to the IGBT 41.

As described above, according to the third embodiment, the reverse conducting diode 42 is formed at the outer circumferential end of the chip. In this way, since a pn junction is not formed at the outer circumferential end of the chip, breakdown does not occur at the outer circumferential end of the chip. Therefore, it is possible to significantly reduce loss (overall loss) due to the operation of the IGBT when a field decay surge is applied, as compared to the related art and thus improve the field decay resistance of the IGBT.

Example 1

Figure 5:
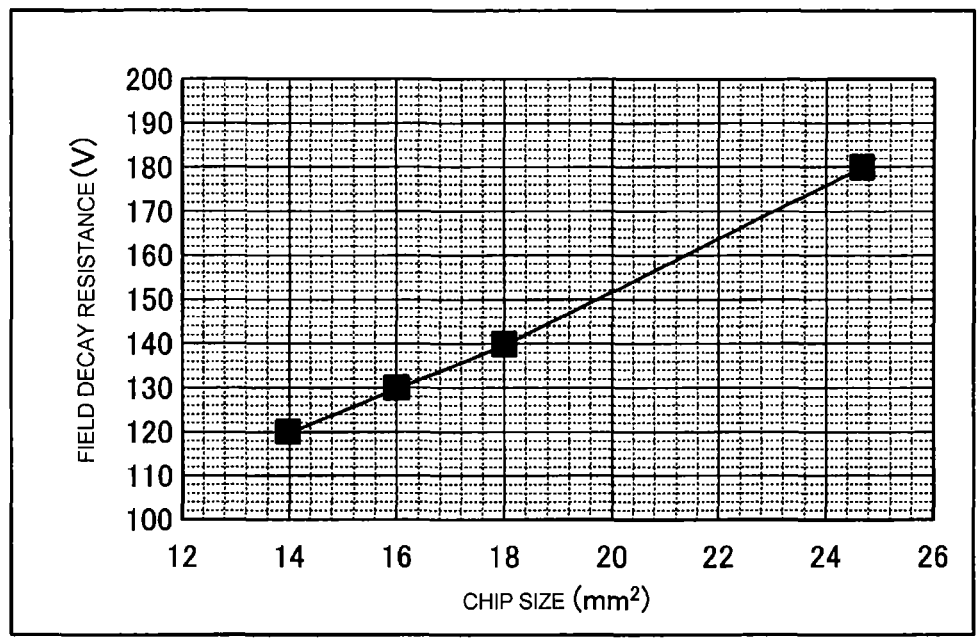
FIG. 5 is a characteristic diagram illustrating the relation between a chip size and a voltage applied by a field decay surge.
Figure 9:
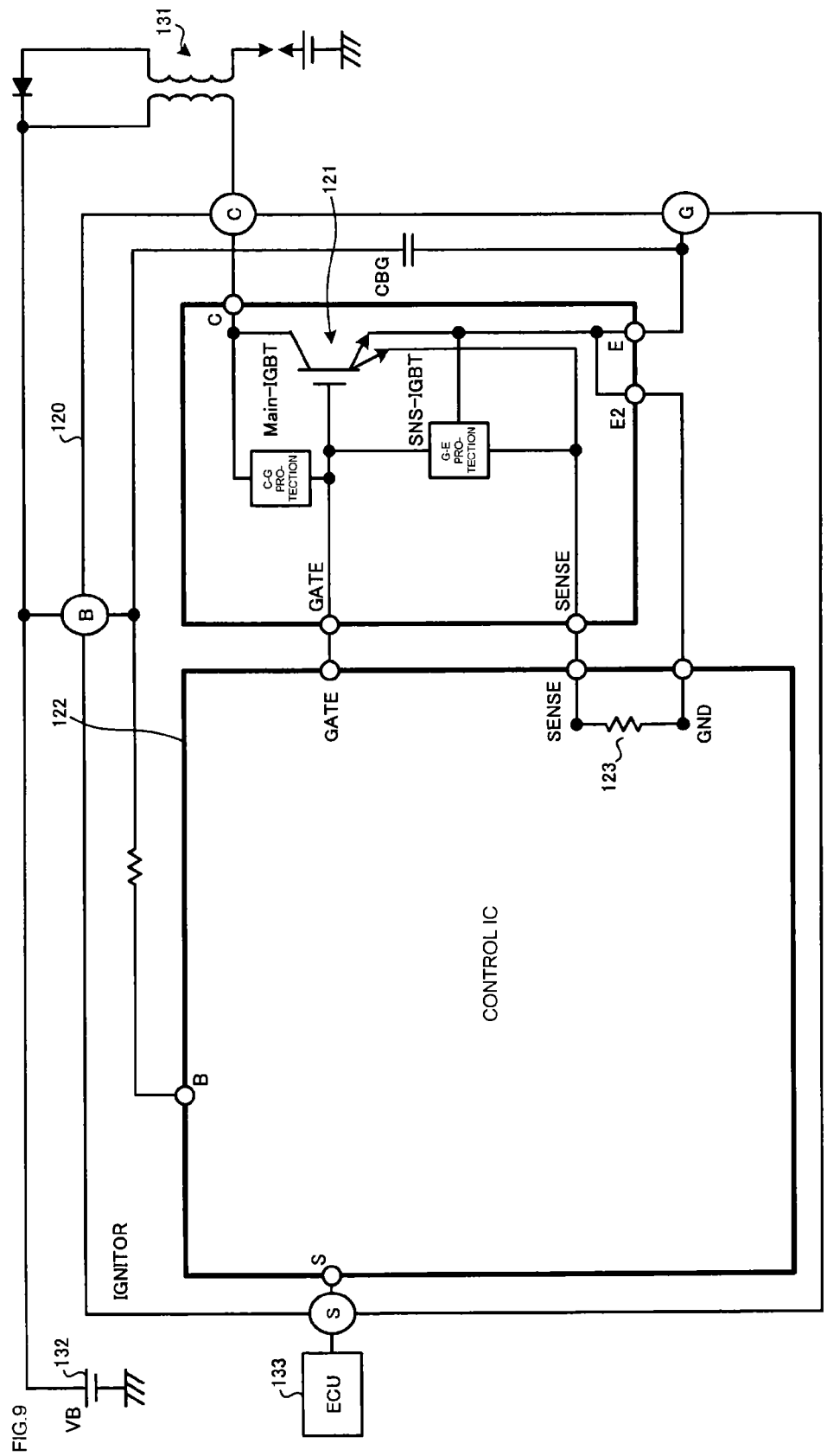
FIG. 9 is a diagram illustrating the circuit structure of an igniter.
Figure 10:
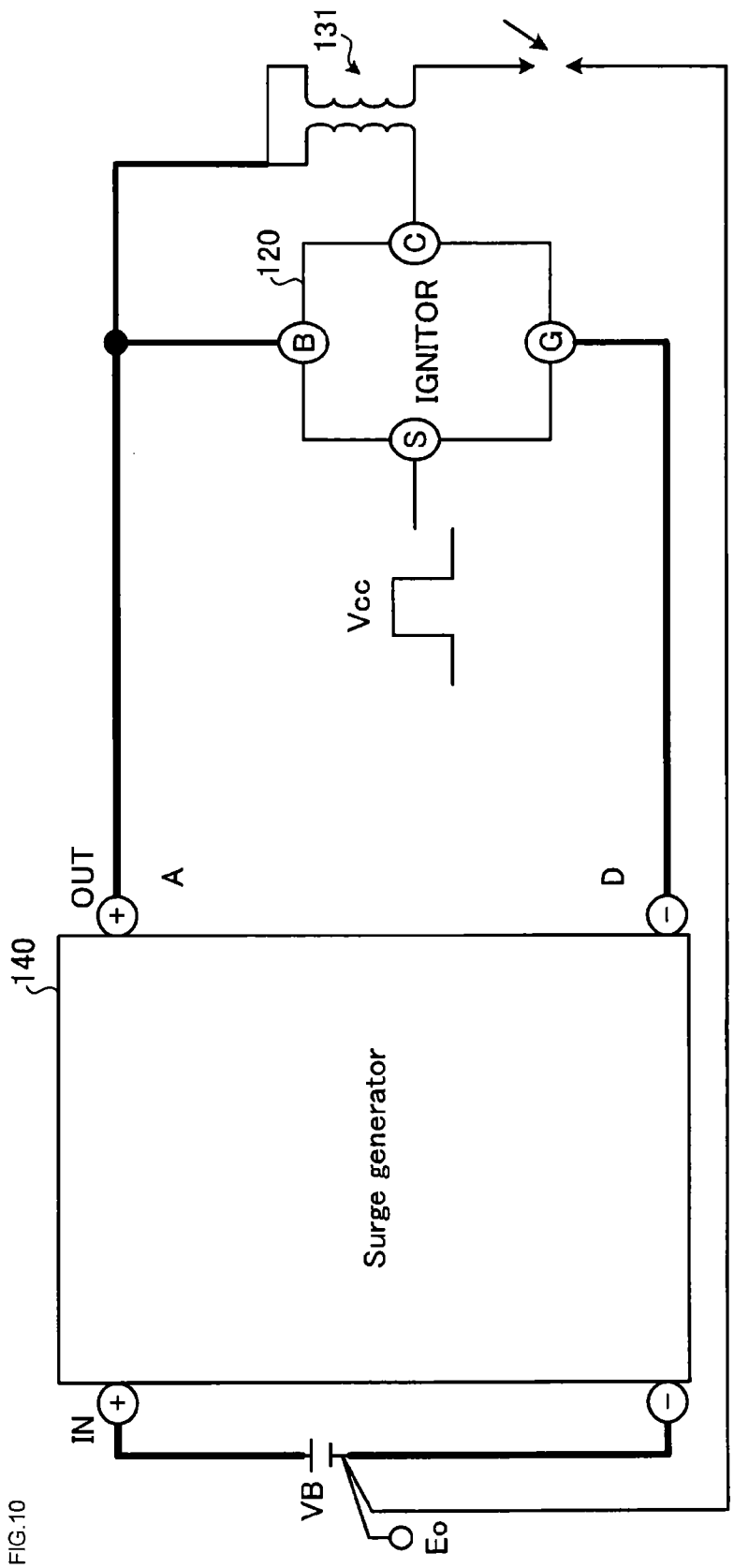
FIG. 10 is a diagram illustrating a field decay test circuit.
Figure 11:
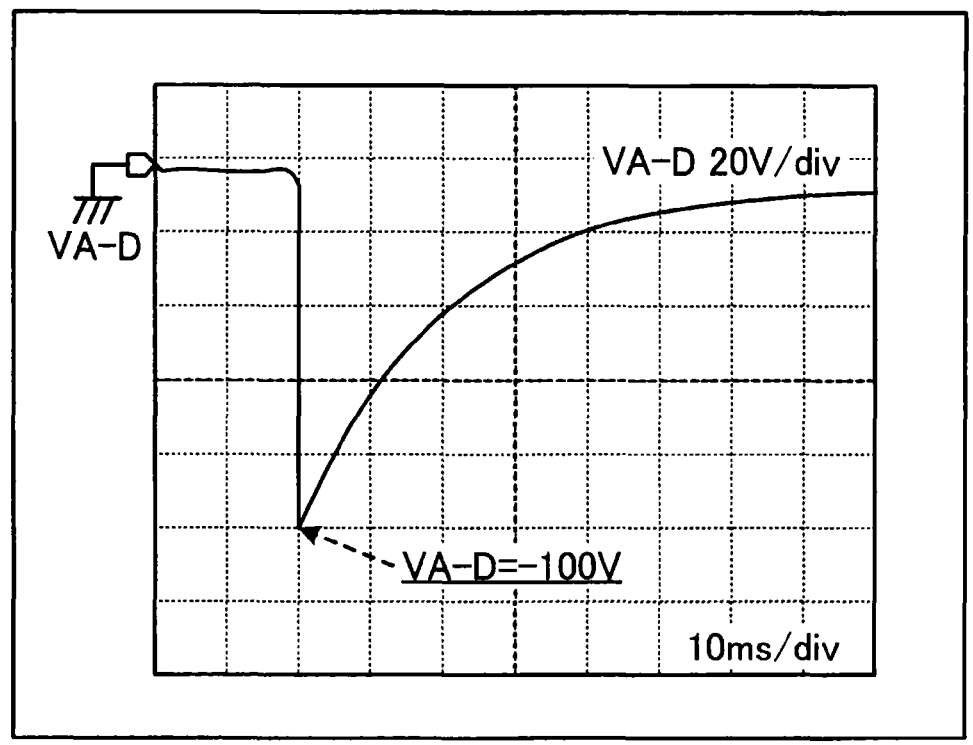
FIG. 11 is a characteristic diagram illustrating the field decay surge waveform of the field decay test.
Figure 12:
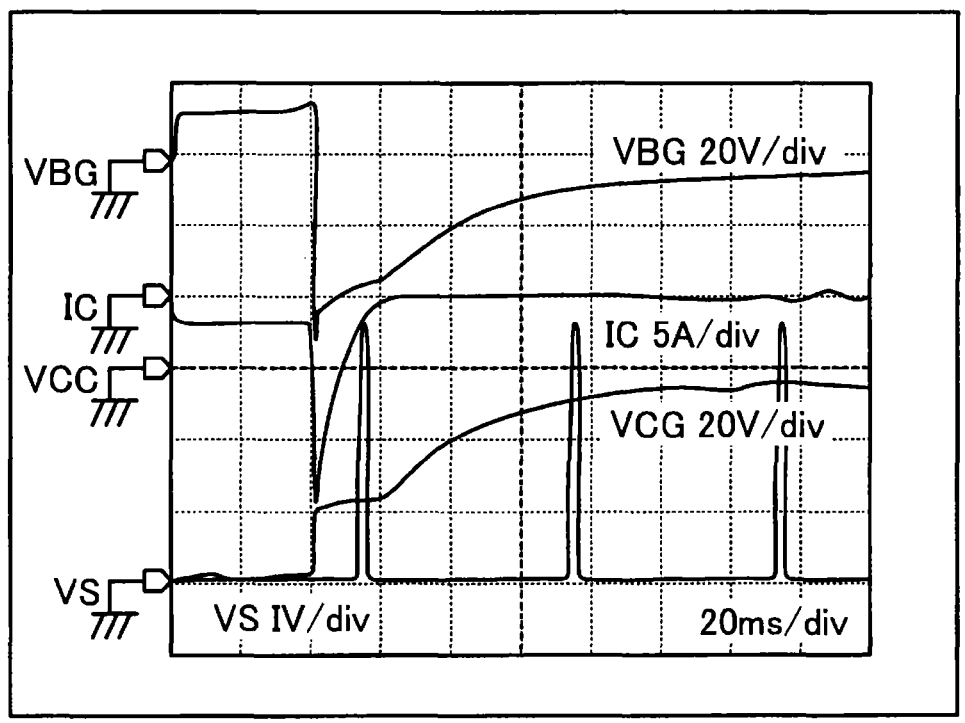
FIG. 12 is a characteristic diagram illustrating the waveform of the operating voltage of an IGBT according to the related art when the field decay surge is applied.
Figure 13:
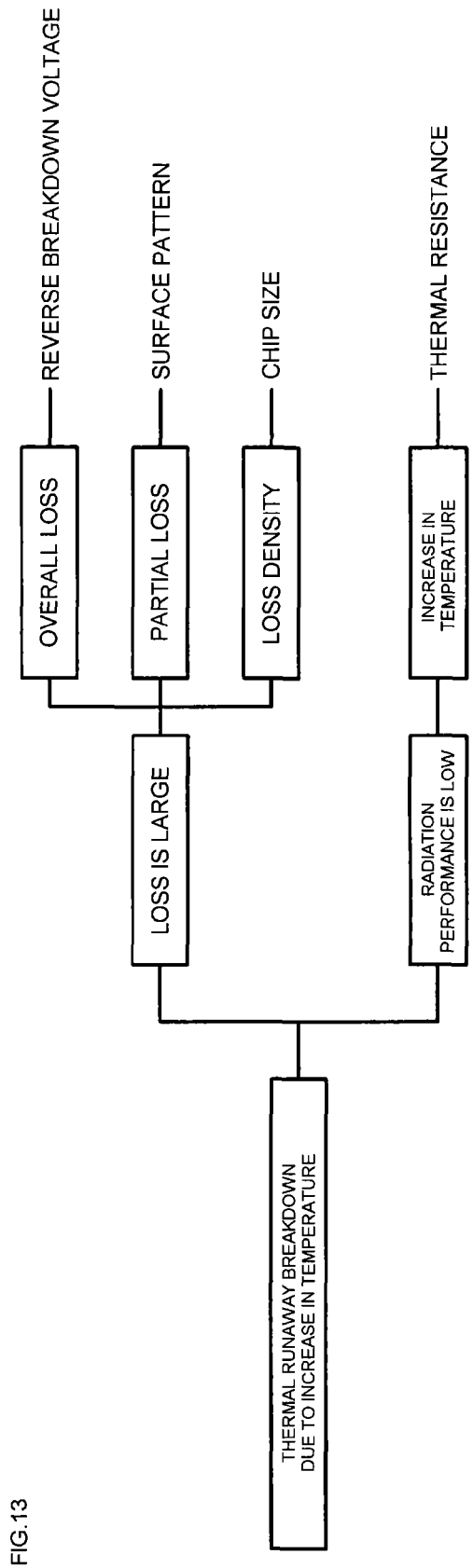
FIG. 13 is a diagram illustrating the main factors of the breakdown of a device due to the field decay surge.

FIG. 5 is a characteristic diagram illustrating the relation between a chip size and a voltage applied by a field decay surge. First, a plurality of IGBTs with different chip sizes according to the first embodiment were manufactured (hereinafter, referred to as examples). In each example, the impurity concentration and thickness of an n⁺ buffer layer 9 were $9.2 \times 10^{16}$ cm⁻³ and 18 μm, respectively. As a comparative example, an IGBT according to the related art was manufactured (see FIG. 14; hereinafter, referred to as a conventional example). In the conventional example, the impurity concentration and thickness of the n⁺ buffer layer were $5.4 \times 10^{16}$ cm⁻³ and 30 μm, respectively. The other structures are the same as those of the examples. As described above, a field decay test was performed for these IGBTs (see FIGS. 9 to 11). The test conditions are the same as the above-mentioned test conditions.

The test result illustrated in FIG. 5 proved that, in both the examples and the conventional example, as the chip size increased, a limit voltage value (hereinafter, referred to as a field decay breakdown voltage) at which breakdown did not occur in the IGBT due to the field decay surge increased. The reason is presumed as follows. When the chip size increases, the junction area of the pn junction of the p collector layer and the n⁺ buffer layer increases and the ratio (loss density) of the loss of the IGBT to the chip size is reduced. Hereinafter, it is assumed that the chip sizes of the samples used in Examples 2 to 4 and the conventional example are all 18 mm².

Example 2

Figure 6:
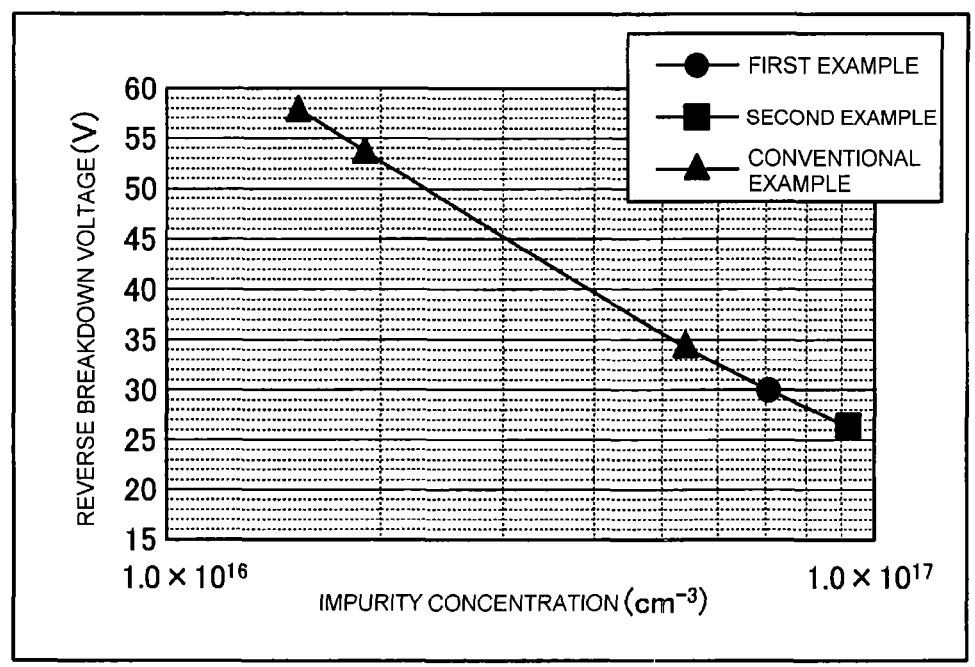
FIG. 6 is a characteristic diagram illustrating the relation between the impurity concentration of a buffer layer and a reverse breakdown voltage.

FIG. 6 is a characteristic diagram illustrating the relation between the impurity concentration of a buffer layer and a reverse breakdown voltage. Two IGBTs were manufactured according to the first embodiment (hereinafter, referred to as first and second examples). In the first Example, the impurity concentration of the n⁺ buffer layer was $7.1 \times 10^{16}$ cm⁻³. In the second example, the impurity concentration of the n⁺ buffer layer was $9.2 \times 10^{16}$ cm⁻³. In both the first and second examples, the thickness of the n⁺ buffer layer was 18 μm. As a comparative example, an IGBT according to a conventional example was manufactured, similarly to Example 1. The field decay tests were performed for the first and second examples and the conventional example, similarly to Example 1.

As can be seen from the result illustrated in FIG. 6, the reverse breakdown voltage was 30 V in the first example. The reverse breakdown voltage was 26.5 V in the second example. The reverse breakdown voltage was 34.5 V in the conventional example. As such, as the impurity concentration of the n⁺ buffer layer increased, the reverse breakdown voltage was reduced.

Example 3

Figure 7:
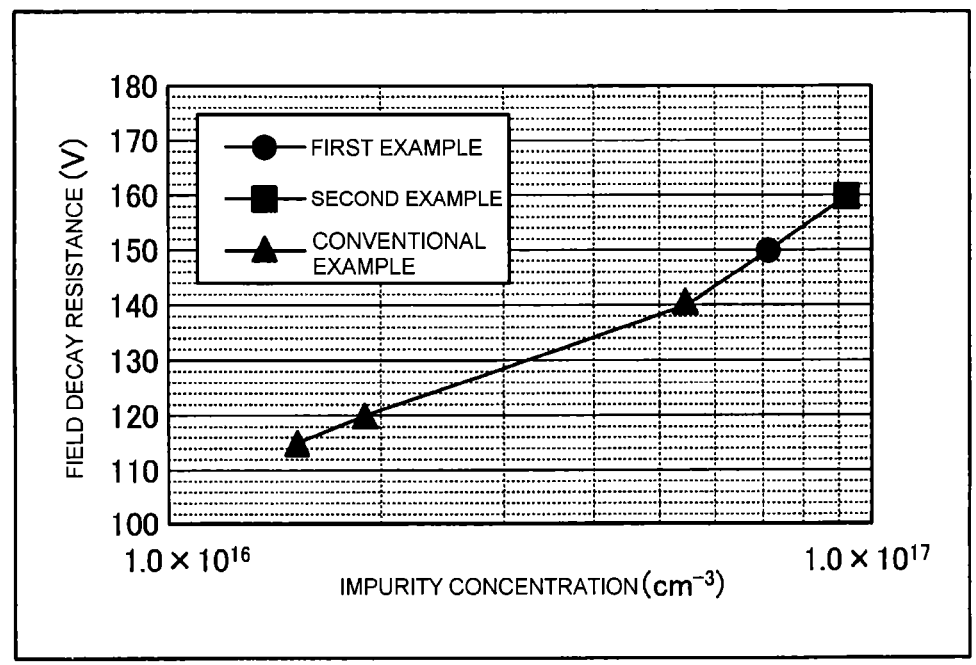
FIG. 7 is a characteristic diagram illustrating the relation between the impurity concentration of the buffer layer and the voltage applied by the field decay surge.

FIG. 7 is a characteristic diagram illustrating the relation between the impurity concentration of a buffer layer and a voltage applied by a field decay surge. Similarly to Example 2, first and second examples and a conventional example were manufactured. Then, the field decay tests were performed for the first and second examples and the conventional example, similarly to Example 1.

As can be seen from the result illustrated in FIG. 7, the field decay breakdown voltage was 150 V in the first example. The field decay breakdown voltage was 160 V in the second example. The field decay breakdown voltage was 140 V in the conventional example. As such, as the impurity concentration of the buffer layer increased, the field decay breakdown voltage was increased. The reason is presumed as follows. When the reverse breakdown voltage is reduced (see Example 2), it is possible to reduce loss due to the operation of the IGBT when a field decay surge is applied.

Example 4

Figure 8:
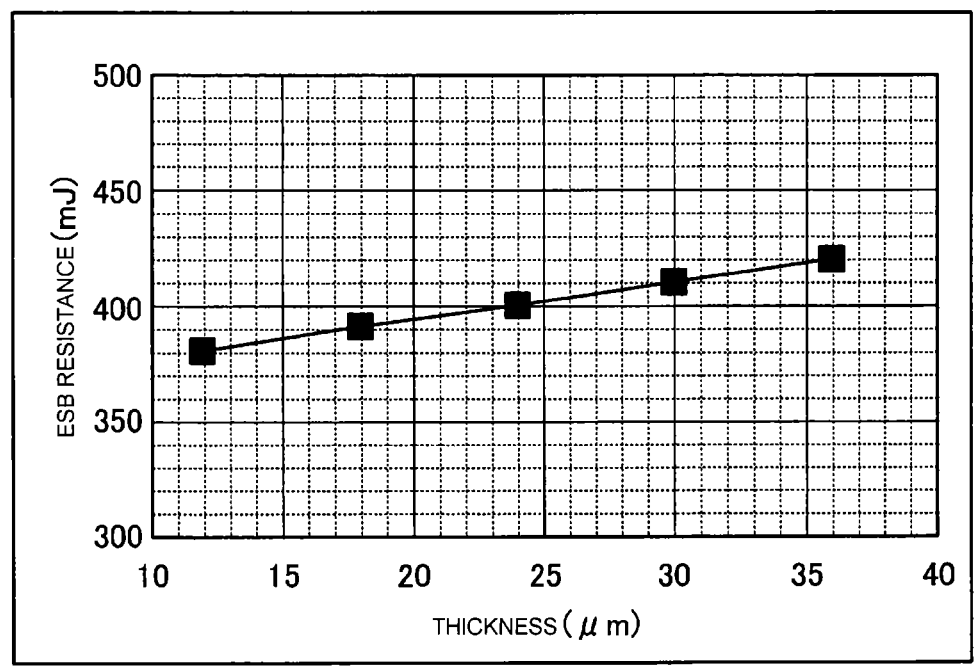
FIG. 8 is a characteristic diagram illustrating the relation between the impurity concentration of the buffer layer and ESB resistance.

FIG. 8 is a characteristic diagram illustrating the relation between the impurity concentration of a buffer layer and ESB resistance. First, a plurality of IGBTs including n⁺ buffer layers with different thicknesses were manufactured according to the first embodiment (hereinafter, referred to as a third example). In the third example, the other structures are the same as those of the first example. Then, the field decay test was performed for the third example, similarly to Example 1.

The result illustrated in FIG. 8 proved that, as the thickness of the n⁺ buffer layer increased, ESB resistance increased. The reason is presumed as follows. When an ignition error occurs in an igniter, it is necessary to discharge energy stored in an ignition coil using the igniter. The amount of energy is generally about several tens of millijoules to 100 mJ. However, in order to achieve an L load clamp, a CBR (Collector Ballasting Resistor) technique is used for the igniter and the n+ buffer layer functions as a ballast resistor. Therefore, during L load clamping, the local concentration of a collector current is reduced. As a result, it is presumed that, when the thickness of the n+ buffer layer increases, ballast resistance increases and ESB resistance is improved. In Example 4, when the thickness of the n+ buffer layer is 18 µm, the ESB resistance is 390 mJ and sufficient ESB resistance to withstand the operation of the IGBT can be obtained.

The invention is not limited to the above-described embodiments, but various modifications and changes of the invention can be made. For example, the electrical characteristic values and dimensions described in the above-described embodiments are illustrative examples, but the invention is not limited thereto. In each of the above-described embodiments, the first conduction type is a p type and the second conduction type is an n type. However, in other embodiments of the invention, the first conduction type may be an n type and the second conduction type may be a p type. In this case, the same effect as described above is obtained.

As described above, according to embodiments of the invention, since the impurity concentration of the second semiconductor layer is higher than that in the related art, it is possible to increase electric field intensity in the vicinity of the interface between the second semiconductor layer and the first semiconductor layer. In this way, it is possible to reduce a breakdown voltage (reverse breakdown voltage) determined by a pn junction of the second semiconductor layer and the first semiconductor layer and thus reduce loss (overall loss) due to the operation of the IGBT when a field decay surge is applied, as compared to the related art.

According to embodiments of the invention, since the first low-resistance layer is not provided at the outer circumferential end of the chip, but the second semiconductor layer is provided at the outer circumferential end of the chip, it is possible to provide a region with the maximum electric field intensity inside the outer circumference of the chip. Therefore, breakdown can occur inside the outer circumference of the chip. In this way, even when the pn junction which determines the reverse breakdown voltage of the IGBT is exposed from the side surface of the chip after dicing, it is possible to prevent an increase in the variation of the reverse leakage current or the reverse breakdown voltage of the IGBT.

According to embodiments of the invention, the reverse conducting diode including the first semiconductor region, the third semiconductor layer, and the second low-resistance layer is formed at the outer circumferential end of the chip. In this way, since a pn junction is not formed at the outer circumferential end of the chip, breakdown does not occur at the outer circumferential end of the chip. Therefore, it is possible to significantly reduce loss (overall loss) due to the operation of the IGBT when a field decay surge is applied, as compared to the related art.

INDUSTRIAL APPLICABILITY

As described above, the semiconductor device according to the invention is useful for a power semiconductor device which is used in, for example, an igniter of a vehicle.

DESCRIPTION OF REFERENCE NUMERALS AND SIGNS 1 n− Drift Layer
2 p Base Region
3 n+ Emitter Region
4 Gate Insulating Film
Gate Electrode
6 Interlayer Insulating Film
7 Emitter Electrode
8 Oxide Film
9 n+ Buffer Layer
10 p Collector Layer
11 Collector Electrode
$t_1$ Thickness of n+ Buffer Layer Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device comprising:
a first semiconductor layer of a first conduction type;
a second semiconductor layer of a second conduction type provided on a surface of the first semiconductor layer and having a thickness equal to or greater than 18 µm and equal to or less than 24 µm;
a third semiconductor layer of the second conduction type provided on a surface of the second semiconductor layer and having an impurity concentration that is equal to or greater than $7\times10^{16}$ cm$^{-3}$, equal to or less than $7\times10^{17}$ cm$^{-3}$, and lower than that of the second semiconductor layer;
a first low-resistance layer of the second conduction type that has sections alternately arranged with sections of the second semiconductor layer, is in contact with the first semiconductor layer and the third semiconductor layer through the second semiconductor layer, and has a higher impurity concentration than that of the second semiconductor layer;
a first semiconductor region of the first conduction type selectively provided in a surface layer of the third semiconductor layer;
a second semiconductor region of the second conduction type selectively provided in a surface layer of the first semiconductor region;
a first electrode provided on a surface of the first semiconductor region interposed between the third semiconductor layer and the second semiconductor region, with an insulating film interposed therebetween;
a second electrode that is in contact with the first semiconductor region and the second semiconductor region; and
a third electrode provided on a surface of the first semiconductor layer which is opposite to the surface on which the third semiconductor layer is provided.

2. The semiconductor device according to claim 1, wherein the first low-resistance layer is provided in a portion other than an outer circumferential end of a substrate.

3. A semiconductor device comprising:
a first semiconductor layer of a first conduction type;
a third semiconductor layer of a second conduction type and is provided on a surface of the first semiconductor layer;
a first semiconductor region of the first conduction type selectively provided in a surface layer of the third semiconductor layer;
a second semiconductor region of the second conduction type selectively provided in a surface layer of the first semiconductor region;
a first electrode provided on a surface of the first semiconductor region interposed between the third semiconductor layer and the second semiconductor region, with an insulating film interposed therebetween;
a second electrode that is in contact with the first semiconductor region and the second semiconductor region;
a third electrode provided on a surface of the first semiconductor layer opposite to the third semiconductor layer; and a second low-resistance layer of the second conduction type that is in contact with the third semiconductor layer and the third electrode through the first semiconductor layer, and has a higher impurity concentration than that of the third semiconductor layer, and is provided at an outer circumferential end of a substrate.

* * * * *